United States Patent [19]
Sato

[11] Patent Number: 5,867,030
[45] Date of Patent: Feb. 2, 1999

[54] TRANSMISSION PATH STRUCTURE FOR MEASURING PROPAGATION DELAY TIME THEREOF

[75] Inventor: Kazuhiko Sato, Ohtone-machi, Japan

[73] Assignee: Advantest Corp., Tokyo, Japan

[21] Appl. No.: 504,455

[22] Filed: Jul. 20, 1995

[30] Foreign Application Priority Data

Jul. 20, 1994 [JP] Japan ................................ 6-189859

[51] Int. Cl.$^6$ ............................ G01R 27/28; G01R 31/26
[52] U.S. Cl. .......................... 324/617; 324/533; 324/765
[58] Field of Search .................................. 324/532, 533, 324/534, 535, 537, 617, 765

[56] References Cited

U.S. PATENT DOCUMENTS

| | | | |
|---|---|---|---|
| 3,670,240 | 6/1972 | Maranchak et al. | 324/535 |
| 4,146,835 | 3/1979 | Chnapko et al. | 324/617 |
| 4,712,061 | 12/1987 | Lach | 324/617 |
| 5,268,644 | 12/1993 | Klassen et al. | 324/503 |
| 5,291,141 | 3/1994 | Farwell et al. | 324/617 |
| 5,381,100 | 1/1995 | Hayashi | 324/617 |
| 5,382,910 | 1/1995 | Walsh | 324/533 |
| 5,440,528 | 8/1995 | Walsh | 324/532 X |
| 5,471,136 | 11/1995 | Pye | 324/158.1 |
| 5,471,145 | 11/1995 | Mydill | 324/532 X |

*Primary Examiner*—Glenn W. Brown
*Attorney, Agent, or Firm*—Muramatsu & Associates

[57] ABSTRACT

The present invention provides a simple circuit for measuring the delay time between a driver (DR) and a device under test (DUT), and the (DUT) and a comparator (CP) during the connection state of an I/O test where separate driver and comparator paths are used. In the connection circuit of the I/O test using two I/O common pins to connect to one of the pins of the DUT, a terminal pin of a DUT socket corresponding to the DUT pin is grounded. Furthermore, in the connection circuit of the I/O test using a DR-only pin and an I/O common pin to connect to the DUT pin, the terminal pin of the DUT socket is grounded and a standard comparator is employed.

7 Claims, 5 Drawing Sheets

INPUT WAVEFORM AT THE POINT (3)

MEASURED WAVEFORM AT THE POINT (4)

TRANSMISSION PATH STRUCTURE FOR MEASURING PROPAGATION DELAY TIME THEREOF

FIELD OF THE INVENTION

The present invention relates to a circuit which measures the propagation delay time of a transmission path by measuring the delay times of cables connected to an end of a device under test (DUT), wherein the cables are connected to the DUT in such a manner as to eliminate the I/O dead band.

BACKGROUND OF THE INVENTION

In conventional semiconductor inspection systems, an ordinary I/O pin electronics circuit includes an I/O common pin 10 which functions as a driver (DR) and comparator (CP) as shown in FIG. 3(a). The DR and CP are connected with a device under test (DUT) to be tested 13 by a cable having a propagation delay time Ta. As is well known in the art, the driver (DR) provides a test signal to the device under test (DUT) and a resultant output signal from the DUT is compared with an expected signal produced by the semiconductor inspection system by the comparator (CP). Also well known in the art, during the test, each DUT is inserted in a DUT socket provided on a test station of the semiconductor inspection system.

FIG. 3(b) is a diagram showing timing for writing and reading operations.

Data R which is read out from the DUT reaches the comparator CP after a propagation delay time Ta. In order to insure that the DUT receives the write data W immediately after the completion of this reading operation, write data W is output from the DR at a time Ta before the writing operation begins in the DUT. Thus, the data W reaches the DUT just as the writing operation begins at the DUT. However, the data W outputted from the driver DR reaches the comparator CP without any delay. Thus, as soon as the data W is output by the driver DR, the data R, which is being read from the DUT, and data W, which is outputted from the DR, interfere (i.e., combine) at the comparator CP. The time during which the interference takes place is twice as long as Ta, so that proper comparison measurements cannot be performed by the comparator CP during this period of time. This period of time is called I/O dead band 20, and is determined by the propagation delay time Ta between the DR and CP and DUT.

In order to measure the propagation delay time Ta, an open circuit is formed at the DUT side as shown in FIG. 4(a). A waveform output from the driver DR is transmitted to the open end of the cable. Thus, the reflection of the transmitted wave returns through the same cable and is detected by the comparator CP. This waveform is shown in FIG. 4(b), and the reflection time can be measured from the waveform by an appropriate measuring instrument such as an oscilloscope, a time interval counter or a time domain reflectometer. Namely, the propagation delay time Ta of the cable is one-half of the time it takes to detect the reflected wave after transmission of the original wave through the cable.

In inspecting a high speed device where the I/O dead band causes a problem, a separate I/O test is performed, wherein the transmission path from the DUT to the CP is separated from the path between the DUT and the DR (see FIG. 5(a)). Due to the split cable configuration of FIG. 5(a), interference will not occur between the data R which is read out from the DUT and data W output from the DR at the comparator CP. Therefore, the proper comparison measurement can be performed by the CP without a dead time. Of course, it will be noted that the waveforms of the read-out data R and output data W interfere at the output of the DR. The collision of these waves will not cause problems because the waves only pass through each other without modulating one another. Moreover, since the waveform from the DUT ends at the DR end, it will not affect the CP end.

If it is desirable to measure the propagation delay time of the cables in the split cable configuration of FIG. 5(a), then the point VT in FIG. 5(a) is placed in a high impedance state (i.e., an open circuit). A signal is transmitted and reflected as before so that the total delay time Tb+Tc can be measured from the DR to the CP through the DUT. However, the delay time Tb from the DR to the DUT and the delay time Tc from the DUT to the CP cannot be separately measured using this method.

SUMMARY OF THE INVENTION

It is an object of the invention to realize a simple circuit for measuring the delay time between the DR and DUT, and DUT and CP for a split cable configuration used in an I/O test.

In order to achieve the above object, in the present invention, a terminal pin of a DUT socket for mounting a device under test (DUT) is grounded in the circuit connection where two I/O common pins are connected.

Further, in the I/O test circuit connection where a DR only pin and I/O common pin are connected to a DUT pin, i.e., the terminal pin of the DUT socket connected to the DUT pin, the the terminal pin is grounded and a common comparator is used for all pins.

In each of the above-described circuits, the time taken to detect a reflected waveform is twice as long as the propagation delay time of each transmission path to the comparator so that the delay time of each transmission time can be measured independently.

DETAILED DESCRIPTION OF THE PREFERRED EMBODIMENT

The first embodiment of the present invention is described with reference to FIGS. 1(a) and 1(b).

Figure 1A:
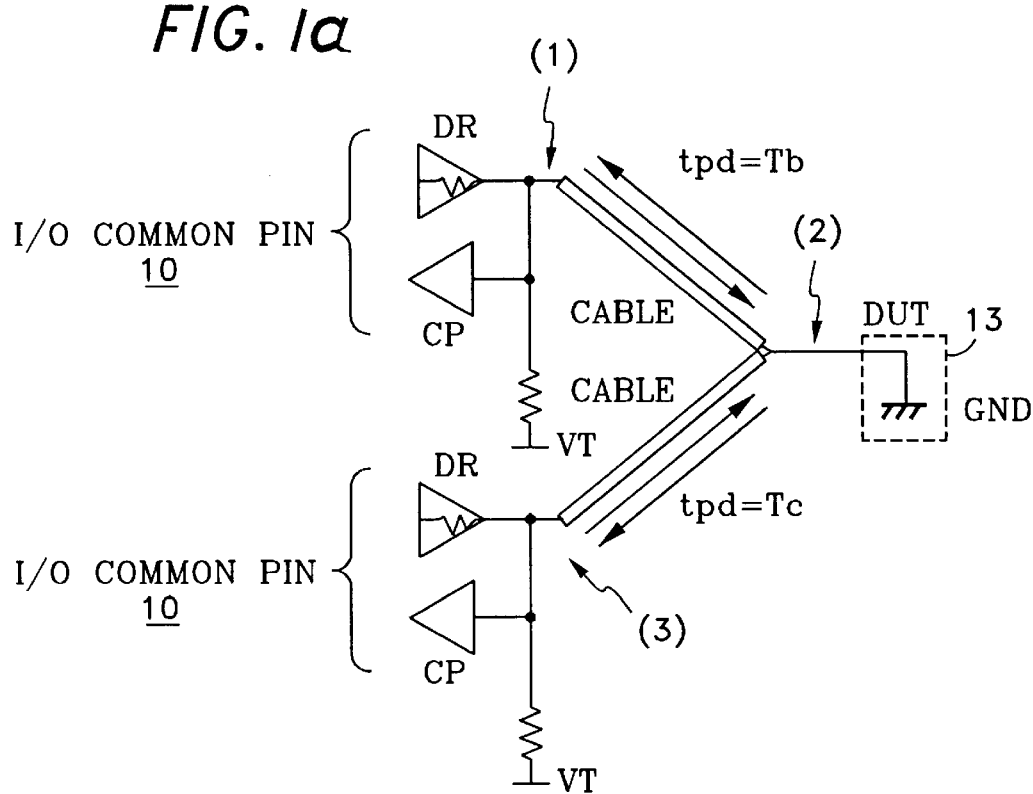
FIGS. 1(a) and 1(b) show a block diagram of a circuit and timing diagram of the first embodiment of the present invention.

FIG. 1(a) shows a block diagram of the delay time measuring circuit wherein two I/O common pins are used. Each delay time can be measured by connecting the terminal pin of the DUT socket, i.e., the DUT pin corresponding to the terminal pin, to the ground. When the waveform output from the DR reaches the terminal pin of the DUT socket through the cable, the voltage goes to the ground state.

Figure 1B:
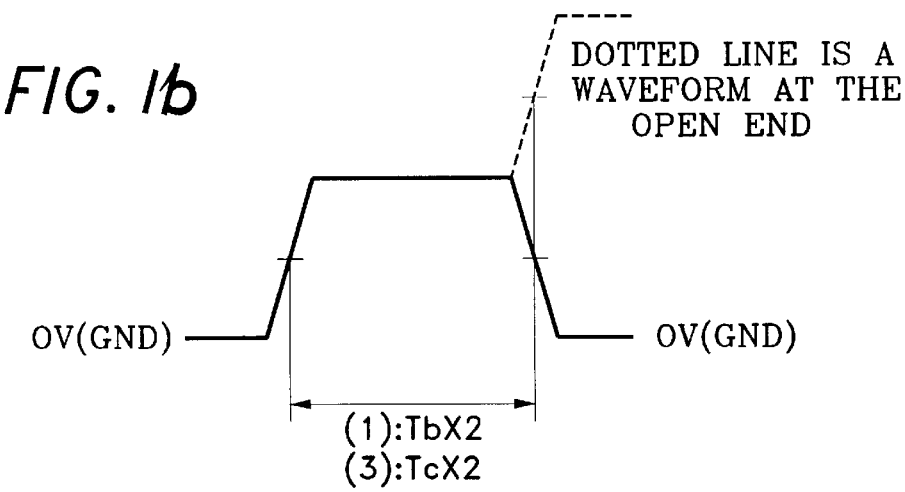

FIG. 1(b) illustrates a waveform measured in this circuit at the point (1) (i.e., at the output of the DR). Because the voltage is reflected as a ground state signal, the propagation time can be measured by measuring the difference between the times that the voltage leaves the ground state and returns to the ground state. The timing diagram shows that the time between the rising edge and the falling edge is twice as long as the propagation delay time Tb, when the DR output waveform is measured at the CP connected at point (1).

The delay time Tc between the DUT and the CP can be also measured by using the DR and the CP connected at point (3).

Therefore, it is possible to measure each propagation delay time independently while not significantly altering the measurement circuit by grounding the terminal of the DUT socket.

The second embodiment is described in the following with reference to FIGS. 2(a) and 2(b).

Figure 2A:
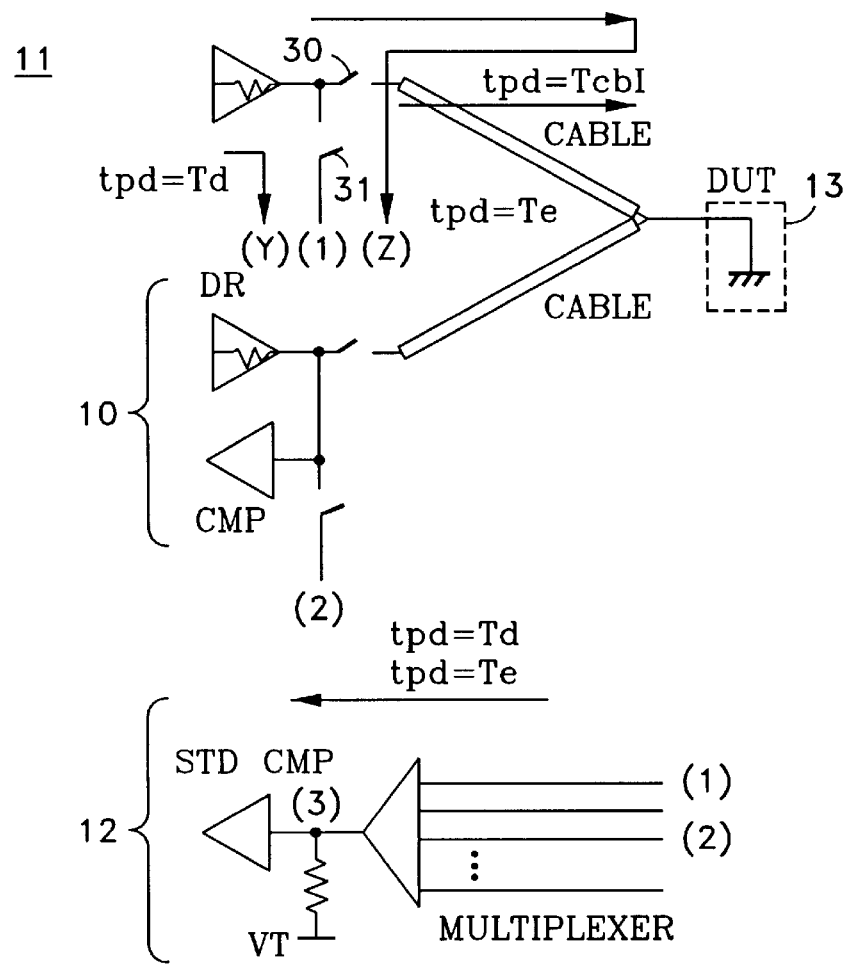
FIGS. 2(a) and 2(b) show a block diagram of a circuit and timing diagram of the second embodiment of the present invention.
Figure 2B:
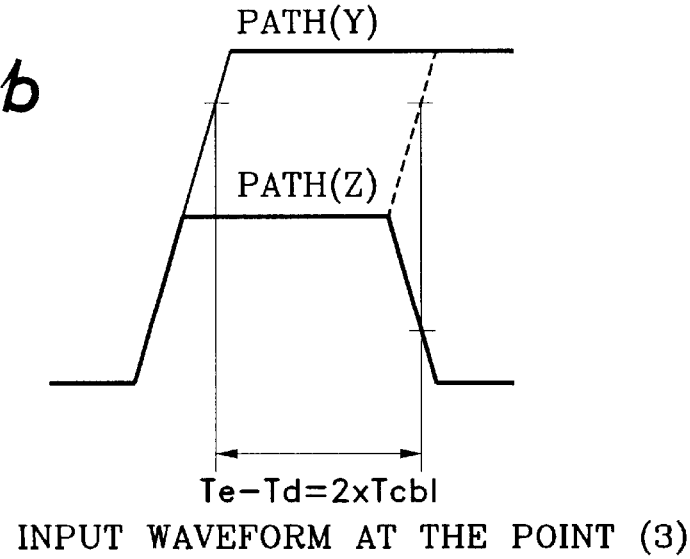
Figure 3A:
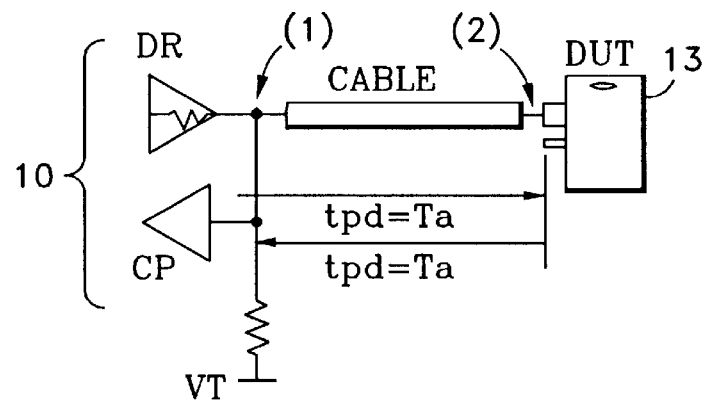
FIGS. 3(a) is a circuit diagram showing a conventional structure and FIG. 3(b) is a timing diagram of the conventional structure of FIG. 3(a) showing the I/O dead band.
Figure 3B:
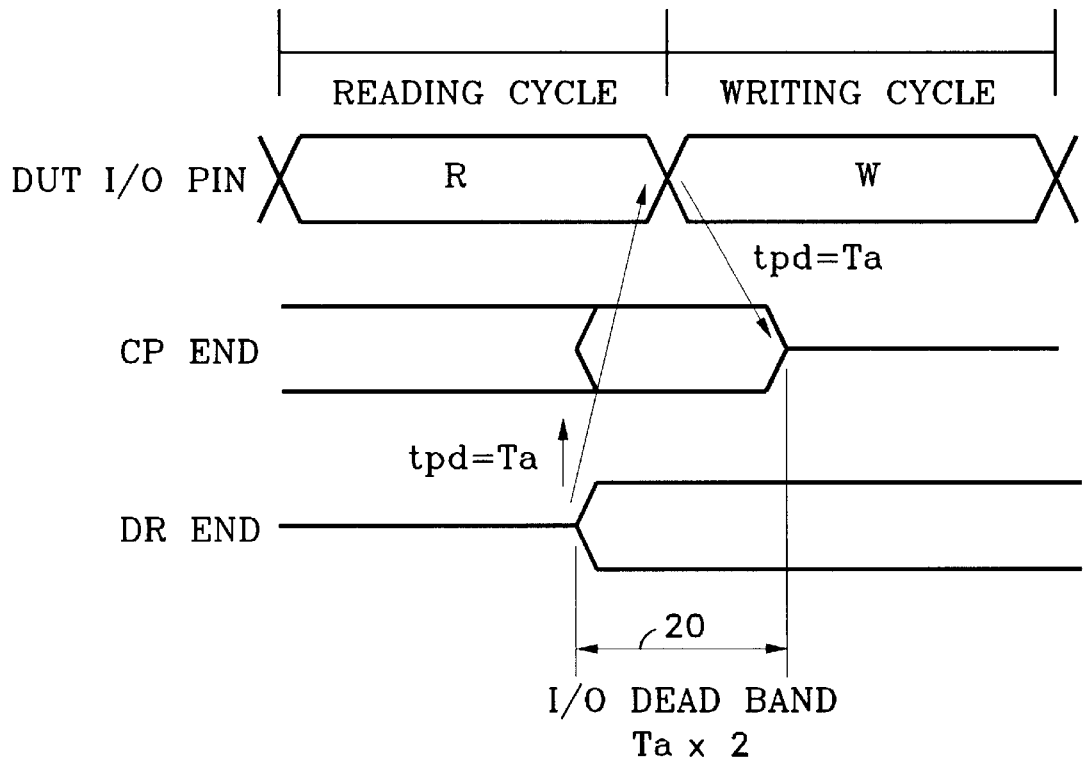
Figure 4A:
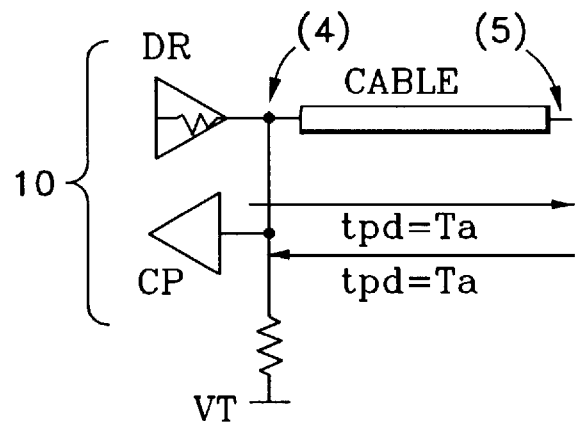
FIG. 4(a) is a circuit diagram and FIG. 4(b) is a timing diagram for measuring the propagation delay time when the DUT end is placed in a high impedance mode.
Figure 4B:
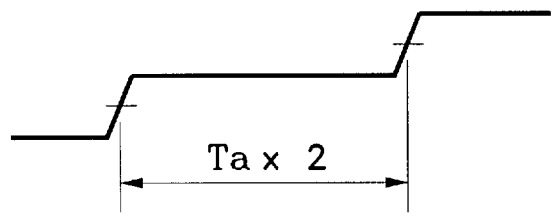
Figure 5A:
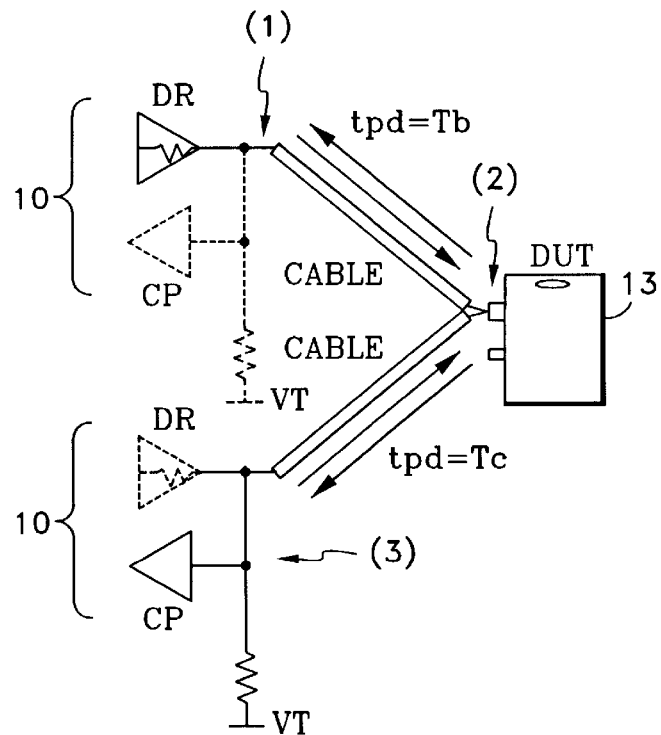
FIG. 5(a) is a circuit diagram and FIG. 5(b) is a timing diagram of the I/O test of the invention where separate cables from the DR and the CP, and the I/O common pin are used.
Figure 5B:
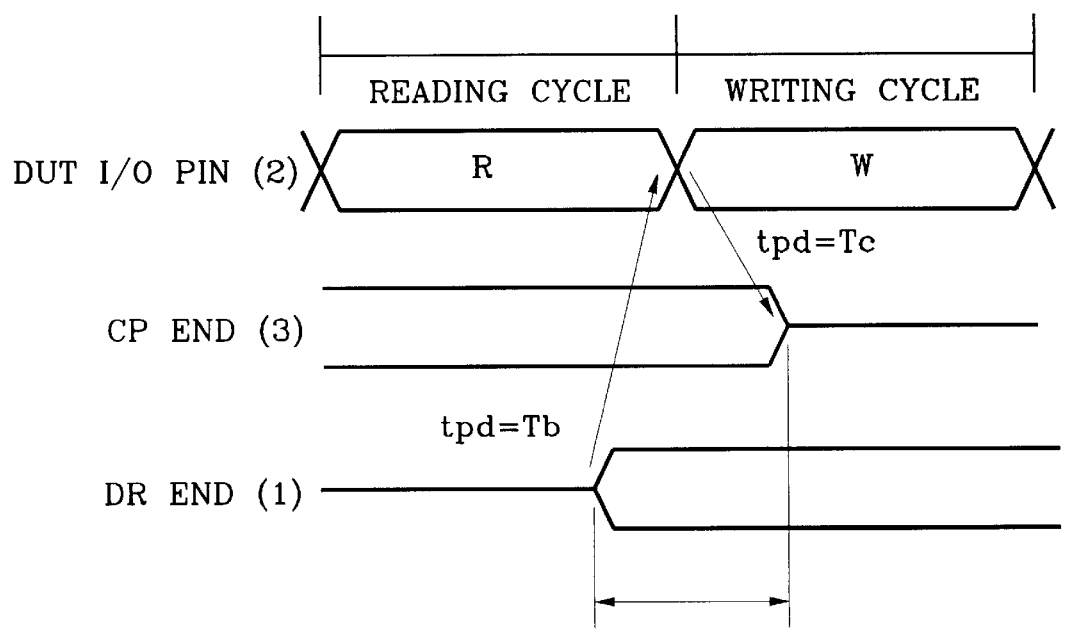

FIG. 2(a) is a block diagram showing a circuit which measures a propagation delay time Tcb1 when the test is performed with use of a pin 11 (connected only to the output of a DR) and an I/O common pin 10. In this case, the use of a standard comparator 12 makes it possible to measure the delay time Tcb1. Such a standard comparator is commonly provided in a semiconductor inspection system for adjusting timing differences or skews among plural I/O pins.

First, a switch 30 is turned OFF, and a switch 31 is turned ON. Then, the propagation delay time Td along the path (Y) between the DR-only pin 11 and the standard comparator 12 is measured. Subsequently, the switches 30 and 31 are turned ON, and the waveform is output from the DR. The waveform reflected at the grounded terminal pin of the DUT socket travels back through the cable, the switch 30 and the switch 31, and is detected at the standard comparator 12 through the switch 31. This path is defined as (Z) and the waveform detected at the standard comparator 12 is shown in FIG. 2(b). Here, the delay time Te−Td is twice as long as Tcb1.

Since the present invention is constructed as described in the foregoing, each propagation delay time can be measured independently without altering the cable connection. Thus, the present invention provides for accurate timing measurement at the DUT pin end by employing each measured data for the adjustment of the delay time in the I/O test where separate cables are used.

I claim:

1. A transmission path structure to be used in a semiconductor test system for measuring propagation delay times of transmission paths, comprising:

a first I/O common pin connected to an output of a first driver which sends a test signal to a device under test (DUT) and to an input of a first comparator which compares an output signal from the DUT with an expected signal;

a DUT socket for mounting the DUT, a terminal pin of said DUT socket being connected to a ground;

a first cable connected between said first I/O common pin and said terminal pin of said DUT socket;

a second I/O common pin connected to an output of a second driver which sends a test signal to the DUT and to an input of a second comparator which compares an output signal from the DUT with an expected signal; and a second cable connected between said second I/O common pin and said terminal pin of said DUT socket.

2. A transmission path structure as defined in claim 1, wherein a propagation delay time of said first cable is evaluated by a time length between a rising edge and a falling edge of a signal observed at the input of said first comparator.

3. A transmission path structure as defined in claim 1, wherein a propagation delay time of said second cable is evaluated by a time length between a rising edge and a falling edge of a signal observed at the input of said second comparator.

4. A transmission path structure to be used in a semiconductor test system for measuring propagation delay times of transmission paths, comprising:

a driver pin connected to an output of a first driver which sends a test signal to a device under test (DUT);

a DUT socket for mounting the DUT, a terminal pin of said DUT socket being connected to a ground;

a first cable connected between said first common pin and said terminal pin of said DUT socket;

an I/O common pin connected to an output of a second driver which sends a test signal to the DUT and to an input of a comparator which compares an output signal from the DUT with an expected signal;

a second cable connected between said I/O common pin and said terminal pin of said DUT socket; and a standard comparator connected to the output of said first driver, said standard comparator selectively receiving an output signal of said first driver directly or a reflected signal of said first driver which has made a round trip to said terminal pin of said DUT socket through said first cable.

5. A transmission path structure as defined in claim 4, further includes a switch for connecting the output of said first driver and said first cable.

6. A transmission path structure as defined in claim 4, wherein a propagation delay time of said first cable is evaluated by a difference in time length between the output signal of said first driver directly and the reflected signal of said first driver which has made the round trip to said terminal pin of said DUT socket through said first cable.

7. A transmission path structure as defined in claim 4, wherein a propagation delay time of each of said second cable is evaluated by a time length between a rising edge and a falling edge of a signal observed at the input of said comparator connected to said I/O common pin.

* * * * *